(12) United States Patent
Carpenter et al.

(10) Patent No.: US 6,753,698 B2
(45) Date of Patent: Jun. 22, 2004

(54) LOW POWER LOW VOLTAGE TRANSISTOR—TRANSISTOR LOGIC I/O DRIVER

(75) Inventors: Gary D. Carpenter, Austin, TX (US); Francis Chan, Williston, VT (US); Kevin J. Nowka, Round Rock, TX (US); Hongfei Wu, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/064,708

(22) Filed: Aug. 8, 2002

(65) Prior Publication Data

US 2004/0027163 A1 Feb. 12, 2004

(51) Int. Cl.[7] ............................................ H03K 19/0175
(52) U.S. Cl. .............................. 326/83; 326/86; 327/108
(58) Field of Search ............................. 326/80–83, 86, 326/87; 327/108–109, 333

(56) References Cited

U.S. PATENT DOCUMENTS

| | | | |
|---|---|---|---|
| 5,977,795 A | | 11/1999 | Lee ............................. 326/70 |
| 6,094,083 A | * | 7/2000 | Noda .......................... 327/333 |
| 6,097,113 A | | 8/2000 | Teraoka et al. ............. 307/125 |
| 6,271,679 B1 | | 8/2001 | McClintock et al. ......... 326/38 |
| 6,323,687 B1 | * | 11/2001 | Yano ............................ 326/83 |
| 6,445,210 B2 | * | 9/2002 | Nojiri .......................... 326/68 |

* cited by examiner

Primary Examiner—James H. Cho
(74) Attorney, Agent, or Firm—Schmeiser, Olsen & Watts; Richard A. Henkler

(57) ABSTRACT

An I/O driver comprising: a circuit adapted to be powered by a first power supply. The circuit is adapted to receive a first signal referenced to the voltage of a second power supply and is adapted to convert the first signal to a second signal of the same logical value as the first signal and referenced to the voltage of the first power supply. The circuit is adapted to maintain the second signal on an output of the I/O driver when the second power supply is powered off.

11 Claims, 2 Drawing Sheets

LOW POWER LOW VOLTAGE TRANSISTOR— TRANSISTOR LOGIC I/O DRIVER

BACKGROUND OF THE INVENTION

The present invention relates to the field of integrated circuits; more specifically, it relates to input/output (I/O) driver circuits in integrated circuit chips having a power saving mode.

BACKGROUND OF THE INVENTION

Power consumption of integrated circuit chips is a critical concern in many applications, for example, in portable devices such as lap-top computers and cell phones. In order to save power, integrated circuits used in power saving applications often include two or more power supplies, the normal chip power supply which may be powered down to save power and a alternative power supply that is powered at all times. However, when integrated circuit chips are in "power saving mode" they often still need to communicate with off chip devices.

As the normal chip power supply voltage is powered down, it is necessary that unknown or "in-between" states not be propagated to off chip devices. Further, when the normal chip power supply is powered back up, it is again necessary that unknown or "in-between" states not be propagated to off chip devices.

Therefore, the possibility of propagating errors between integrated circuits that may be placed in power saving mode and off chip devices is a problem of significant concern to designers of power saving mode chips.

BRIEF SUMMARY OF THE INVENTION

A first aspect of the present invention is an I/O driver comprising: a circuit adapted to be powered by a first power supply, the circuit adapted to receive a first signal referenced to the voltage of a second power supply and adapted to convert the first signal to a second signal of the same logical value as the first signal and referenced to the voltage of the first power supply, the circuit adapted to maintain the second signal on an output of the I/O driver when the second power supply is powered off.

A second aspect of the present invention is An I/O driver comprising: a first circuit adapted to be powered by a first power supply, the first circuit adapted to receive a first signal referenced to the voltage of a second power supply and adapted to convert the first signal to a second signal of the same logical value as the first signal and referenced to the voltage of the first power supply; the first circuit including a first latching circuit, the first latching circuit adapted to maintain the logical state of the second signal when the second power supply is powered off; a second circuit adapted to be powered by the first power supply, the second circuit adapted to receive a third signal referenced to the voltage of the second power supply and adapted to convert the third signal to a fourth signal of the same logical value as the second signal and referenced to the voltage of the first power supply; the second circuit including a second latching circuit, the second latching circuit adapted to maintain the logical state of the fourth signal when the second power supply is powered off; and a combinational logic circuit adapted to combine the second and fourth signals into a fifth signal to maintain the fifth signal on an output of the I/O driver when the second power supply is powered off.

A third aspect of the present invention is a method of maintaining the output state of an I/O driver when an integrated circuit chip is in a low power mode comprising: providing a circuit adapted to be powered by a first power supply, the circuit adapted to receive a first signal referenced to the voltage of a second power supply and adapted to convert the first signal to a second signal of the same logical value as the first signal and referenced to the voltage of the first power supply, the circuit adapted to maintain the second signal on an output of the I/O driver when the second power supply is powered off.

BRIEF DESCRIPTION OF THE SEVERAL VIEWS OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

VDDG is defined as a global voltage supplied to an integrated circuit chip that is powered off during power saving mode. VDDX (where X is an integer) is defined as an alternative voltage supplied to specific circuits that are kept powered during power saving mode. Fencing is defined as the operation of holding I/O pads of a integrated circuit chips in power saving mode at known voltage states while VDDG is off or sequencing on or off. In one example, VDDG is lower than VDDX. In another example VDDX is about 2.5 volts or higher and VDDG is 1.8 volts or lower.

Figure 1:
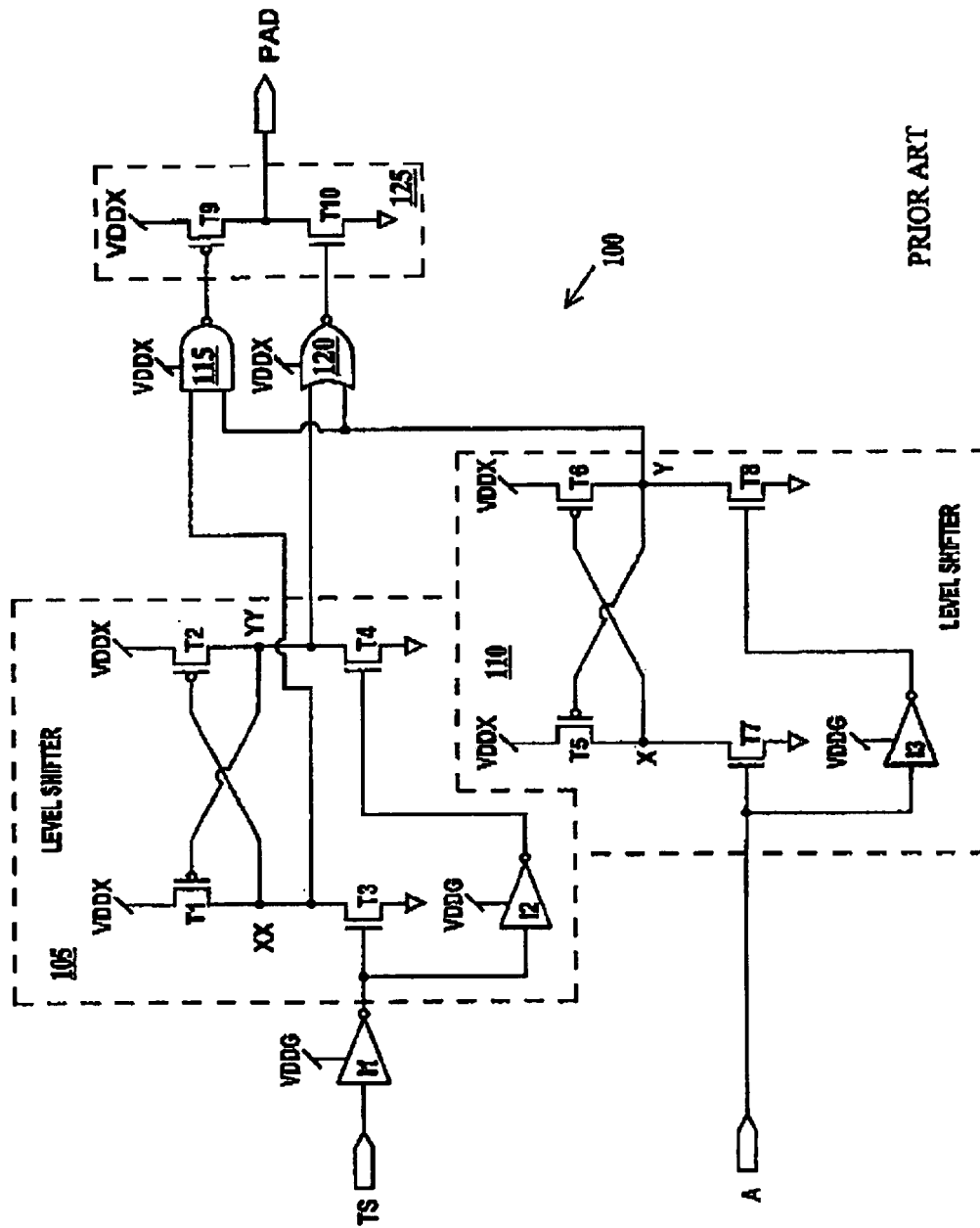
FIG. 1 is a schematic diagram of an I/O driver circuit.

FIG. 1 is a schematic diagram of an I/O driver circuit. In FIG. 1, I/O driver 100 includes a TS input, an A input, a PAD output, an inverter I1, a first level shifter 105, a second level shifter 110, a NAND gate 115, a NOR gate 120 and output circuit 125. Input TS is coupled to an input of inverter I1. Inverter I1 is coupled to VDDG. The output of inverter I1 is coupled to an input of first level shifter 105. A first output of first level shifter 105 is coupled to a first input of NAND gate 115 and a second output of first level shifter 105 is coupled to a first input of NOR gate 120. NAND gate 115 and NOR gate 120 are each coupled to VDDX. Input A is coupled to an input of second level shifter 110. An output of second level shifter 110 is coupled to a second input of NAND gate 115 and to a second input of NOR gate 120. The output of NAND gate 115 is coupled to a first input of output circuit 125 and the output of NOR gate 120 is coupled to a second input of output circuit 125. The output of output circuit 125 is coupled to output PAD.

First level shifter 105 includes PFETs T1 and T2, NFETs T3 and T4 and inverter I2. The sources of PFETs T1 and T2 are coupled to VDDX and the drains of PFETs T1 and T2 are coupled respectively to nodes XX and YY. Node XX is coupled to a first output of first level shifter 105 and node YY is coupled to a second output of level shifter 105. The gate of PFET T1 is coupled to node YY and the gate of PFET T2 is coupled to node XX. The drain of NFET T3 is coupled to node XX and the drain of NFET T4 is coupled to node YY. The sources of NFETs T3 and T4 are coupled to ground. The gate of NFET T3 and the input of inverter I2 are both coupled to the input to level shifter 105, which is coupled to the output of inverter I1 as described supra. Inverter I1 is coupled to VDDG. Node XX is coupled to the first input of NAND gate 115 and node YY is coupled to the first input of NOR gate 120.

Second level shifter 110 is similar to first level shifter 105. Second level shifter 110 include PFETs T5 and T6, NFETs T7 and T8 and inverter I3, wherein PFETs T5 and T6, NFETs T7 and T8 and inverter I3 of second level shifter 110 correspond respectively to PFETs T1 and T2, NFETs T3 and T4 and inverter I2 of first level shifter 105. Nodes X and Y of second level shifter 110 correspond respectively to nodes XX and YY of first level shifter 105. The differences being the gate of NFET T7 and the input of inverter I3 are both coupled to input A and node Y is coupled to the second input of NAND gate 115 and node Y is coupled to the second input of NOR gate 120.

Output circuit 125 includes a PFET T9 and an NFET T10. The source of PFET T9 is coupled to VDDX and the source of NFET T10 is coupled to ground. The drains of PFET T9 and NFET T10 are coupled to each other and to the output of output circuit 125, which is coupled to output PAD as described supra. The gate of PFET T9 is coupled to the first input of output circuit 125, which is coupled to the output of NAND gate 115 as described supra. The gate of NFET T10 is coupled to the second input of output circuit 125, which is coupled to the output of NOR gate 120 as described supra.

In operation input TS receives a mode signal referenced to a voltage VDDG (or another voltage) indicating the mode of I/O driver 100. A logical 1 indicates normal function mode and a logical 0 indicates a tri-state mode. Input A receives a data signal referenced to VDDG (or another voltage) that is either a logical 0 or a logical 1. Both the mode signal and the data signal are level shifted from the voltage they are received at to VDDX, the mode signal shifted by first level shifter 105 and the data signal shifted by second level shifter 110.

In a first scenario, with VDDG on, and a mode signal that is a logical 1 (normal mode) on input TS, NFET T3 is off, PFET T1 is on, node XX is at a logical 1, NFET T2 is on, PFET T2 is off, and node YY is at a logical 0. With a logical 0 data signal on input A, NFET T7 is off, PFET T5 is on, node X is at a logical 1, NFET T8 is on, PFET T6 is off and node Y is at a logical 0. With node XX at a logical 1, node YY at a logical 0 and node Y at a logical 0, the signal at output PAD is at a logical 0, the same as input A.

In a second scenario, with VDDG on, and a mode signal that is a logical 1 (normal mode) on input TS, NFET T3 is off, PFET T1 is on, node XX is at a logical 1, NFET T2 is on, PFET T2 is off, and node YY is at a logical 0. With a logical 1 data signal on input A, NFET T7 is on, PFET T5 is off, node X is at a logical 0, NFET T8 is off, PFET T6 is on and node Y is at a logical 1. With node XX at a logical 1, node YY at a logical 0 and node Y at a logical 1, the signal at output PAD is at a logical 1, the same as input A.

In a third scenario, with VDDG on, and a mode signal that is a logical 0 (tri-state mode) on input TS, NFET T3 is on, PFET T1 is off, node XX is at a logical 0, NFET T4 is off, PFET T2 is on, and node YY is at a logical 1. With node XX at a logical 0, node YY at a logical 1, regardless of the state of nodes X and Y, NAND gate 115 at a logical 1, NOR gate 120 is at a logical 0 and both PFET T9 and NFET T10 are off and the signal at output PAD is floating or unknown.

In a fourth scenario, which includes first and second scenarios, VDDG is powered down (VDDX is still on), the chip is in power saving mode(VDDG=0). With VDDG off the outputs of inverters I1 and I2 are zero turning both NFETs T3 and T4 off so nodes XX and YY are unknown or floating which in turn causes output PAD to be unknown or floating. Therefore, in power saving mode, the state of the output PAD is lost and may or may not be recovered after VDDG is powered back up.

Figure 2:
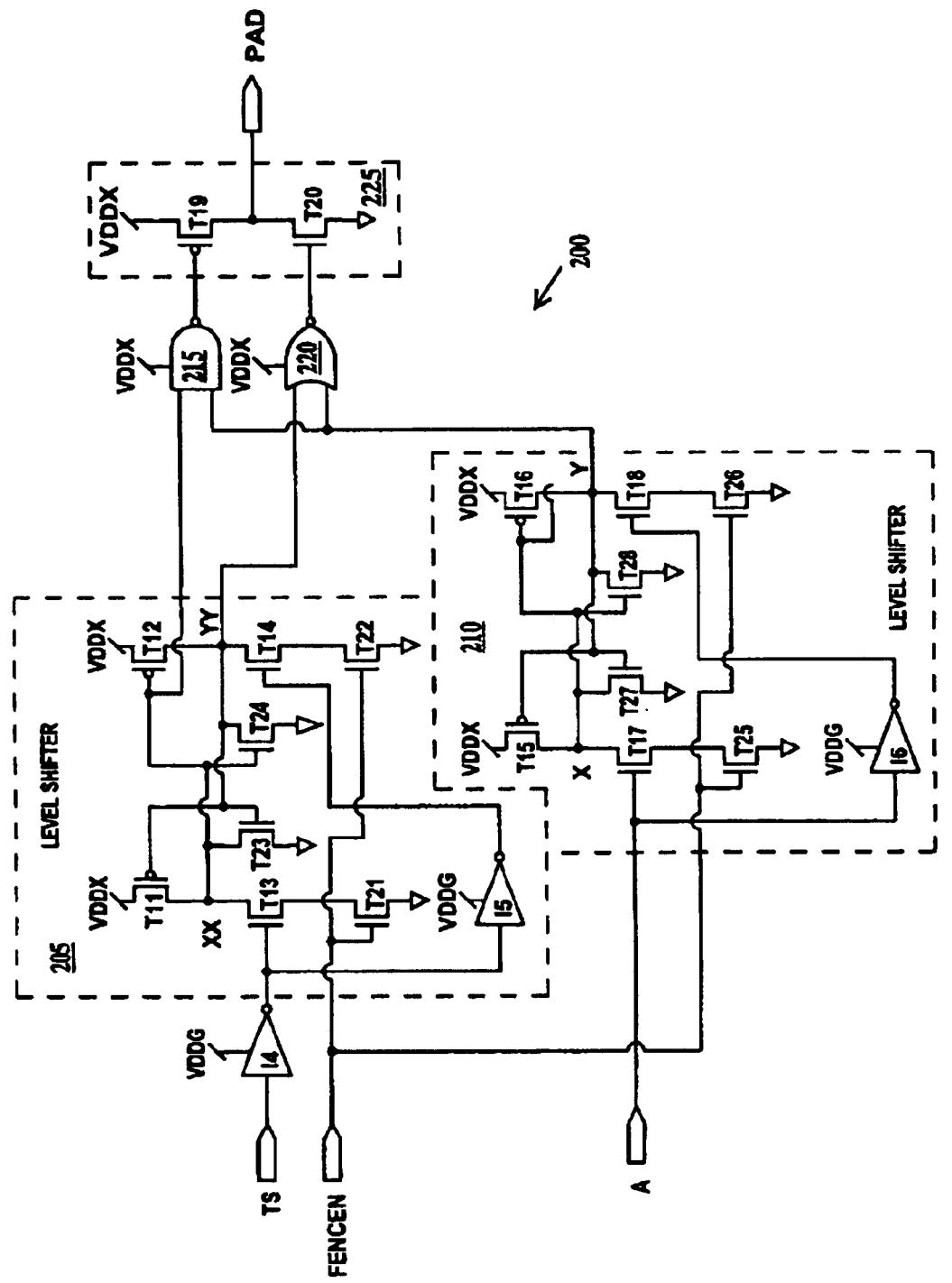
FIG. 2 is a schematic diagram of an I/O driver circuit according to the present invention.

FIG. 2 is a schematic diagram of an I/O driver circuit according to the present invention. In FIG. 2, I/O driver 200 includes a TS input, an A input, a FENCEN input, a PAD output, an inverter I4, a first level shifter 205, a second level shifter 210, a NAND gate 215, a NOR gate 220 and output circuit 225. Output PAD is coupled to an I/O pad of an integrated circuit chip containing I/O driver 200. Input TS is coupled to an input of inverter I4. Inverter I4 is coupled to VDDG. The output of inverter I4 is coupled to a first input of first level shifter 205. Input FENCEN is coupled to a second input of first level shifter 205. A first output of first level shifter 205 is coupled to a first input of NAND gate 215 and a second output of first level shifter 205 is coupled to a first input of NOR gate 220. NAND gate 215 and NOR gate 220 are each coupled to VDDX. Input A is coupled to a first input of second level shifter 210. Input FENCEN is coupled to a second input of second level shifter 210. A first output of second level shifter 210 is coupled to a second input of NAND gate 215 and a second output of second level shifter 210 is coupled to a second input of NOR gate 220. The output of NAND gate 215 is coupled to a first input of output circuit 225 and the output of NOR gate 220 is coupled to a second input of output circuit 225. The output of output circuit 225 is coupled to output PAD.

First level shifter 205 includes PFETs T11 and T12, NFETs T13, T14, T21, T22, T23 and T24 and inverter I5. The sources of PFETs T11 and T12 are coupled to VDDX and the drains of PFETs T11 and T12 are coupled respectively to nodes XX and YY. Node XX is coupled to a first output of first level shifter 205 and node YY is coupled to a second output of level shifter 205. The gate of PFET T11 is coupled to node YY, the gate of NFET T23 and the drain of NFET T24. The gate of PFET T12 is coupled to node XX, the gate of NFET T24 and the drain of NFET T23. The drain of NFET T13 is coupled to node XX and the drain of NFET T14 is coupled to node YY. The sources of NFETs T13 and T14 are coupled to the drains of NFETs T21 and T22 respectively. The sources of NFETs T21 and T22 are each coupled to ground. The gate of NFET T13 and the input of inverter I5 are both coupled to the input of level shifter 205, which is coupled to the output of inverter I4 as described supra. Inverter I4 is coupled to VDDG. Node XX is coupled to the first input of NAND gate 215 and node YY is coupled to the first input of NOR gate 220.

Second level shifter 210 is similar to first level shifter 205. Second level shifter 210 include PFETs T15 and T16, NFETs T17, T18 and T25, T26, T27 and T28 and inverter I6, wherein PFETs T15 and T16, NFETs T17, T18 and T25, T26, T27 and T28 and inverter I6 of second level shifter 210 correspond respectively to PFETs T11 and T12, NFETs T13, T14, T21, T22, T23 and T24 and inverter I5 of first level shifter 205. Nodes X and Y of second level shifter 210 correspond respectively to nodes XX and YY of first level shifter 205. The differences being the gate of NFET T17 and the input of inverter I6 are both coupled to input A and node Y is coupled to the second input of NAND gate 215 and to the second input of NOR gate 220.

Output circuit 225 includes a PFET T19 and an NFET T20. The source of PFET T19 is coupled to VDDX and the source of NFET T20 is coupled to ground. The drains of PFET T19 and NFET T20 are coupled to each other and to the output of output circuit 225, which is coupled to output PAD as described supra. The gate of PFET T19 is coupled to the first input of output circuit 225, which is coupled to the output of NAND gate 215 as described supra. The gate of NFET T20 is coupled to the second input of output circuit 225, which is coupled to the output of NOR gate 220 as described supra.

In operation input TS receives a mode signal referenced to a voltage VDDG (or another voltage) indicating the mode of I/O driver 200. A lobical 1 indicates normal function mode and a logical 0 indicates a tri-state mode. Input A receives a data signal referenced to VDDG (or another voltage) that is either a logical 0 or a logical 1. Both the mode signal and the data signal are level shifted from the voltage they are received at to VDDX, the mode signal by first level shifter 205 and the data signal by second level shifter 210. When input FENCEN receives a fencing signal that is a logical 1 (fencing off) NFETs T21, T22 T25 and T26 turn on and circuit operation proceeds normally. When input FENCEN receives a fencing signal that is a logical 0 (fencing on, prior to going into power saving mode) NFETs T21, T22 T25 and T26 turn off and the logical value of the signal on input TS are latched by NFETs T23 and T24 and the logical value of the signal on input A is latched by NFETs T27 and T28 as described infra. The fencing signal is received at input FENCEN before VDDG is powered off. FENCEN is referenced to a backup power supply VDDBU. FENCEN remains at a logical 0 when VDDG is powered down.

In a first scenario, with VDDG on, a mode signal that is a logical 1 (normal mode) on input TS and a fencing signal that is a logical 1 (no fencing) on input FENCEN, NFETs T21, T22, T25 and T26 are on, NFET T13 is off, PFET T11 is on, node XX is at a logical 1, NFET T12 is on, PFET T12 is off, and node YY is at a logical 0. With a logical 0 data signal on input A, NFET T17 is off, PFET T15 is on, node X is at a logical 1, NFET T18 is on, PFET T16 is off and node Y is at a logical 0. With node XX at a logical 1, node YY at a logical 0 and node Y at a logical 0, the signal at output PAD is at a logical 0, the same as input A.

In a second scenario, with VDDG on, a mode signal that is a logical 1 (normal mode) on input TS and a fencing signal that is a logical 1 (no fencing) on input FENCEN, NFETs T21, T22, T25 and T26 are on, NFET T13 is off, PFET T11 is on, node XX is at a logical 1, NFET T12 is on, PFET T12 is off, and node YY is at a logical 0. With a logical 1 data signal on input A, NFET T17 is on, PFET T15 is off, node X is at a logical 0, NFET T18 is off, PFET T16 is on and node Y is at a logical 1. With node XX at a logical 1, node YY at a logical 0 and node Y at a logical 1, the signal at output PAD is at a logical 1, the same as input A.

In a third scenario, with VDDG on, and a mode signal that is a logical 0 (tri-state mode) on input TS and a fencing signal that is a logical 1 (no fencing) on input FENCEN, NFETs T21, T22, T25 and T26 are on, NFET T13 is on, PFET T11 is off, node XX is at a logical 0, NFET T14 is off, PFET T12 is on, and node YY is at a logical 1. With node XX at a logical 0, node YY at a logical 1 both and node Y at a logical 1, both PFET T19 and NFET T20 are off and the signal at output PAD is floating or unknown.

In a fourth scenario, which includes first and second scenarios, input TS is at a logical 1, then VDDG is powered down (VDDX is still on), the chip is put in power saving mode (VDDG=0), fencing is turned on (input FENCEN is at a logical 0) and then the logical state of input TS floats. With fencing turned on NFETs T21, T22, T25 and T26 are turned off. NFETs T23 and T24 hold nodes XX and YY at the logical values set by the state of input TS before VDDG was powered down (either NFET T23 and PFET T12 are on and NFET T24 and PFET T11 are off or NFET T23 and PFET T12 are off and NFET T24 and PFET T11 are on). NFETs T27 and T28 hold node Y at the logical value set by the state of input A before VDDG was powered down (either NFET T27 and PFET T16 are on and NFET T28 and PFET T15 are off or NFET T273 and PFET T162 are off and NFET T28 and PFET T15 are on). With nodes XX, YY and Y "latched" the logical value at output PAD is held at the state of input A before VDDG was powered down. VDDG is powered back up before fencing is turned off. The turning of fencing off (FENCEN back to a logical 1) is timed to occur (at the system level) when the signal on input A is the same as before VDDG was powered down to avoid "glitching" (primarily a clocking problem) and one of normal skill in the art may design a glitch preventing circuit keeping in mind that it may be necessary for that glitch preventing circuit to be powered by VDDX.

Thus, the present invention provides a need for an I/O driver circuit communicating between integrated circuits that may be placed in power saving mode and off chip devices that does not propagate unknown or "in-between" states to off chip devices during power down or power up.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. An I/O driver comprising:
   a first circuit adapted to be powered by a first power supply, said first circuit adapted to receive a first signal referenced to the voltage of a second power supply and adapted to convert said first signal to a second signal of the same logical value as said first signal and referenced to the voltage of said first power supply, said first circuit including a first latching circuit, said first latching circuit adapted to maintain the logical state of said second signal when said second power supply is powered off;
   a second circuit adapted to be powered by said first power supply, said second circuit adapted to receive a third signal referenced to the voltage of said second power supply and adapted to convert said third signal to a fourth signal of the same logical value as said second signal and referenced to the voltage of said first power supply, said second circuit including a second latching circuit, said second latching circuit adapted to maintain the logical state of said fourth signal when said second power supply is powered off; and
   a combinational logic circuit adapted to combine said second and fourth signals into a fifth signal and adapted to maintain said fifth signal on an output of said I/O driver when said second power supply is powered off.

2. The I/O driver of claim 1, wherein the voltage of said first power supply is higher than the voltage of said second power supply.

3. The I/O driver of claim 2, wherein the voltage of said first power supply is 2.5 volts or higher.

4. The I/O driver of claim 1, wherein said first circuit includes a first level shifting circuit and said second circuit includes a second level shifting circuit.

5. The I/O driver of claim 4, wherein said first level shifting circuit further includes a first latching circuit and said second level shifting circuit further includes a second latching circuit.

6. The I/O driver of claim 1, wherein said first circuit includes a first latching circuit and said second circuit includes a second latching circuit.

7. The I/O driver of claim 1, further including an output circuit coupled between said combinational logic circuit and said output of said I/O driver.

8. The intergrated circuit of claim 1, further including a first fencing circuit adapted to receive a fencing signal and a first latching circuit adapted to latch said second signal in response to said first fencing circuit receiving a fencing on signal prior to powering down said first power supply; and a second fencing circuit adapted to receive said fencing signal and a second latching circuit adapted to latch said fourth signal in response to said second fencing circuit receiving said fencing on signal.

9. The I/O driver of claim 1, where in said combination logic circuit includes a NAND gate and a NOR gate.

10. An I/O driver comprising:

a circuit adapted to be powered by a first power supply, said circuit adapted to receive a first signal referenced to the voltage of a second power supply and adapted to convert said first signal to a second of the same logical value as said first signal and referenced to the voltage of said first power supply, said circuit adapted to maintain said second signal on an output of said I/O driver when said second power supply is powered off; and a fencing circuit adapted to receive a fencing signal and a latching circuit adapted to latch said second signal in response to said fencing circuit receiving a fencing on signal.

11. A method of maintaining the output state of an I/O driver when an integrated circuit chip is in a low power mode comprising:

providing a circuit adapted to be powered by a first power supply, said circuit adapted to receive a first signal referenced to the voltage of a second power supply and adapted to convert said first signal to a second signal of the same logical value as said first signal and referenced to the voltage of said first power supply, said circuit adapted to maintain said second signal on an output of said I/O driver when said second power supply is powered off;

providing a fencing circuit adapted to receive a fencing signal; and providing a latching circuit adapted to latch said second signal in response to said fencing circuit receiving a fencing on signal.

* * * * *